US008890016B2

(12) United States Patent
Silverman

(10) Patent No.: US 8,890,016 B2
(45) Date of Patent: Nov. 18, 2014

(54) TOUCH PAD DEVICE

(75) Inventor: Joshua Silverman, Long Beach, NY (US)

(73) Assignee: Stilotech Inc., Jericho, NY (US)

( * ) Notice: Subject to any disclaimer, the term of this patent is extended or adjusted under 35 U.S.C. 154(b) by 335 days.

(21) Appl. No.: 13/331,116

(22) Filed: Dec. 20, 2011

(65) Prior Publication Data

US 2012/0152711 A1 Jun. 21, 2012

Related U.S. Application Data

(60) Provisional application No. 61/425,532, filed on Dec. 21, 2010.

(51) Int. Cl.
*H01H 13/14* (2006.01)
*H03M 11/00* (2006.01)

(52) U.S. Cl.
CPC .................................... *H01H 13/14* (2013.01)
USPC ............................................ 200/341; 341/27

(58) Field of Classification Search
USPC ............ 345/184, 174, 173, 168, 169; 341/27, 341/21-23; 715/864, 865; 200/341
See application file for complete search history.

(56) References Cited

U.S. PATENT DOCUMENTS 3,823,548 A * 7/1974 Riba ................................ 368/21
4,855,550 A * 8/1989 Schultz, Jr. .................... 200/600
5,183,346 A * 2/1993 Tesar ............................ 400/490
5,355,148 A * 10/1994 Anderson ..................... 345/166
5,977,867 A * 11/1999 Blouin ....................... 340/407.2
6,259,044 B1 * 7/2001 Paratore et al. ............... 200/5 A
6,903,662 B2 * 6/2005 Rix et al. ......................... 341/22
6,924,752 B2 * 8/2005 Gettemy et al. ................ 341/34
6,977,811 B1 * 12/2005 Fleck et al. .............. 361/679.18
7,085,130 B2 * 8/2006 Lin et al. .................... 361/679.1
7,800,587 B2 * 9/2010 Kato ............................. 345/168
8,058,967 B2 * 11/2011 Laurent et al. .................. 338/47
8,206,047 B1 * 6/2012 Isaac et al. ..................... 400/491
8,258,418 B2 * 9/2012 Chen .......................... 200/302.1
8,436,817 B2 * 5/2013 Oh ................................ 345/173
2002/0175057 A1 * 11/2002 Swanson ....................... 200/5 A
2002/0180707 A1 * 12/2002 Sato et al. ..................... 345/169
2003/0167669 A1 * 9/2003 Rohne et al. ..................... 40/594
2005/0042013 A1 * 2/2005 Lee ............................... 400/490
2005/0083306 A1 * 4/2005 Monary ......................... 345/168
2005/0164148 A1 * 7/2005 Sinclair ........................ 434/112
2005/0180099 A1 * 8/2005 Lin et al. ........................ 361/683
2006/0256090 A1 * 11/2006 Huppi ........................... 345/173
2007/0052691 A1 * 3/2007 Zadesky et al. ............... 345/173
2008/0101840 A1 * 5/2008 Chaumont et al. ............ 400/490
2008/0238879 A1 * 10/2008 Jaeger et al. .................. 345/173
2009/0020402 A1 * 1/2009 Ichikawa et al. .............. 200/341
2009/0315989 A1 * 12/2009 Adelson ........................ 348/135
2010/0328251 A1 * 12/2010 Sinclair ........................ 345/174
2011/0050587 A1 * 3/2011 Natanzon et al. ............. 345/173
2011/0227841 A1 * 9/2011 Argiro .......................... 345/173
2011/0298721 A1 * 12/2011 Eldridge ....................... 345/173
2011/0316785 A1 * 12/2011 Hidary .......................... 345/168
2012/0038468 A1 * 2/2012 Provancher ................ 340/407.1
2012/0050165 A1 * 3/2012 Kim et al. ...................... 345/168

* cited by examiner

*Primary Examiner* — Briggitte R Hammond

(57) ABSTRACT

A touch pad for an operating button of an electronics device provides a contact point for tactile input through the button. The button is adhesively mounted to the button, the surface of the electronics device surrounding the button, or both button and surrounding surface. The pad preferably fully overlies the button, and may have a lower surface that conforms to the shape of the top surface of the button.

7 Claims, 2 Drawing Sheets

TOUCH PAD DEVICE

The present invention is an operating button attachment for electronic devices. The present application claims the benefit of Provisional Patent Application 61/425,532 filed Dec. 21, 2010.

BACKGROUND OF THE INVENTION

Numerous electronic devices use designated input areas, often in the form of "buttons" to which finger pressure is applied and interpreted to enter a command, and as the supporting technology has expanded, the use to which a single input element can be put has expanded. For example, when Apple Inc.'s iPhone operating system was introduced in 2007, its input button, the "home" button, was simply used to exit an application and return to the home screen. Subsequent advancements, such as Apple's iOS 4 operating system, introduced to the public in 2010, provided for multi-tasking. Such increased functionality incorporated "double clicking" the home button to switch between applications. The home button thus has matured to the point where it is now a multi function/multi purpose input/control element, having functionality that has expanded far beyond its original single click purpose to return "home". Other electronics devices of other manufacturers have or can be expected to adopt similar functionality, providing a single (or several) button(s) to perform a plurality of tasks and/or enter a variety of commands, particularly in portable devices in which available space for operating controls may be at a premium.

While use of such operating buttons has increased, they often have an upper contact surface which is recessed from the surrounding bezel or surface on which the button is mounted. While such a construction provides for a degree of security against inadvertent contact, it often hinders effective contact, and offers little in the way of tactile feedback.

Because of the multi-tasking feature of a home button or similar tactile input device, the button is used on a continuous basis, and it is important that the user have increased control and comfort in using the button. In addition, it would be advantageous to provide a button with means by which it can be easily tactilely identified. This can be of particular benefit when a group of buttons is present, whereby a particular button can be differentiated in a tactile manner to confirm its location and identity. Improving the tactile quality of operating buttons may also be of benefit to the visually impaired.

BRIEF DESCRIPTION OF THE INVENTION

In accordance with the forgoing and other benefits, the present invention allows for easier use of an operating button; such as in "double clicking" or applying a directed force to the button to control, for example, a displayed cursor when the button functions as a peripheral device. The invention is a disc shaped device with an adhesive backing, allowing the device to be affixed to the "home" or other designated control button on an electronics device. The device is intended to be applied to any electronic or mechanical device control button, and can be of a variety of shapes, although in a preferred form it is disc shaped.

When applied to a device's operating button, access to the button is enhanced, and the surface texture of the device can improve the reliability of the intended operation as well as the tactile response to the user.

DETAILED DESCRIPTION OF THE INVENTION

Figure 1:
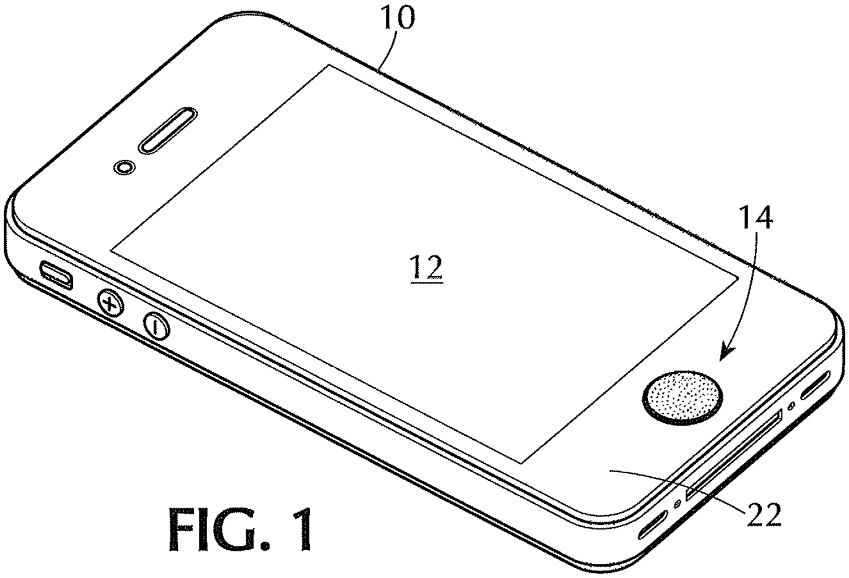
FIG. 1 is a perspective view of a mobile electronics device with the invention in place thereon.
Figure 2:
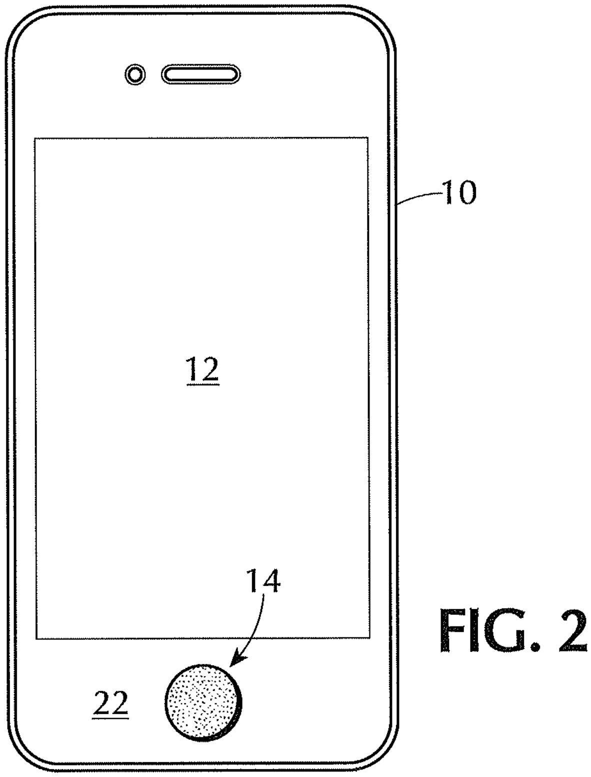
FIG. 2 is a top plan view of the device of FIG. 1.

As shown in FIGS. 1 and 2, 10 is a representative mobile electronics device, such as a cell phone. In addition to the device's screen 12, which may be touch-sensitive, a "home" button is provided towards the lower edge of the device's front face surface 22. The button may be recessed from the surrounding surface and can be difficult to access. In the Figures the button is shown overlaid with the present invention 14. It completely covers the button, providing a raised area that can be easily contacted and which transmits the applied finger pressure to the button which it overlies.

Figure 3:
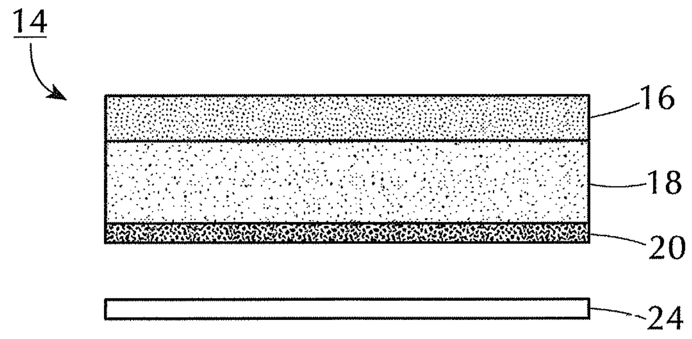
FIG. 3 is an elevation view of the invention.

As depicted in the Figures, the device may preferably be in the form of a disc, the general construction of which may be seen in FIG. 3, intended to generally conform to the outline shape of the button over which it is positioned. The disc has a top layer 16, the top surface of which accepts the finger pressure of the user. The top layer may be formed of a variety of materials, including coarse fabrics, as well as materials with other textures, such as grooved rubber and foam. Depending on the nature of the top layer, a backing layer 18 may also be used to provide additional thickness to the device and/or to further control the tactile response of the device. For example, the backing layer may be of foam to provide further flexibility and cushioning. Alternatively, if the upper layer itself has sufficient flexibility, the backing layer may be a less resilient material, serving primarily to raise the top layer.

Bottom layer 20 is an adhesive that allows the device 14 to be affixed to the operating button which it overlies. Typically, the adhesive, as known in the art, is applied directly to the adjoining layer 18 (or 16). A removable liner 24 initially covers the bottom surface of the adhesive layer, and is removed by the user to expose the adhesive when the device is to be installed on the electronic device.

Figure 4:
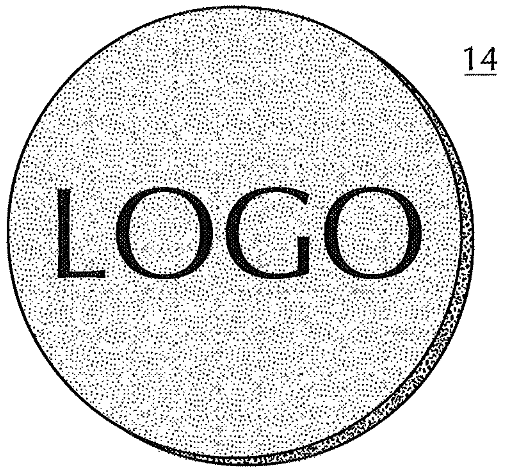
FIG. 4 is an illustration of how the invention may be ornamented.

The diameter of the device 14 may be varied as appropriate to accommodate operating buttons of various sizes. A diameter of about 9.5 mm (3/8"), for example, may be appropriate for installation on the Apple Inc. iPhone product. As depicted in FIG. 4, the top surface of the device may be imprinted with a logo or design to customize the device. In addition, the top layer 16 can be colored or otherwise decorated using any technique as known in the art. In addition to being round, the shape of the device may likewise be varied. Square, rectangular and hexagonal shapes in plan, for example, may be employed. So long as the operating button with which the device is to be used is adequately overlaid, the shape of the device may be varied as desired.

While as shown in FIG. 3 the adhesive layer 20 is coextensive with the area of the bottom surface of the layer upon which it lies, it need not be. The adhesive may be in the form of a ring or central spot. In addition, in conjunction with the size of the device 14 itself, which may be sized to overlie only the intended operating button or both the button and a portion of the surrounding surface 22, the adhesive may be sized and located to adhere the device 14 to the button, the button's surrounding surface, or both.

Figure 5:
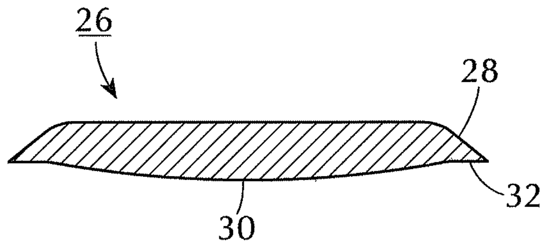
FIG. 5 is a cross-sectional view of a preferred embodiment of the invention.

FIG. 5 presents a cross-sectional view of a preferred embodiment, as may be used, for example on an Apple Inc. iPhone unit. The device 26 is circular in plan, constructed of silicone rubber, and may have a diameter of 13.2 mm and an overall thickness of 1.5 mm. The major portion of the upper surface is flat, with sloping peripheral edge 28 of about 1 mm in width. The intersection between the flat central portion and the edge 28 may bear a radius of 0.5 mm. The bottom surface of the device may be contoured to more readily accommodate a depressed operating button. Thus, the bottom central surface portion 30 is arcuate, with a contour that complements that of the upper surface of the button which it is to contact. The central portion is surrounded by planar peripheral rim 32, 1 mm in width. In general the depth of the central portion below the rim is on the order of 0.5 mm.

The construction of FIG. 5 is intended to overlie both the corresponding button and a portion of the surrounding unit surface. Thus, the adhesive layer (not shown) may preferably be provided at the bottom rim 32. It may, however, also extend onto the central portion 30 to allow device attachment directly to the overlaid button.

As set forth herein, the present invention adds functionality and design customization to the device upon which it is installed and with it is used, providing easier button location and more comfortable clicking.

I claim:

1. A touch pad for an operating button of an electronics device, comprising:

a first layer with an upper surface providing a contact point for user tactile input;

an adhesive layer for affixing the touch pad to the operating button; and an intermediate layer positioned between the first layer and the adhesive layer.

2. The touch pad of claim 1, wherein the first layer is of silicone rubber.

3. The touch pad of claim 1 wherein the intermediate layer is of foam.

4. The touch pad of claim 1, wherein the first layer has a size in plan equal or greater than the size in plan of the operating button.

5. The touch pad of claim 4, wherein the first layer is circular in plan.

6. The touch pad of claim 4, wherein the adhesive layer is coextensive with the size of the first layer.

7. The touch pad of claim 4, wherein the size of the first layer is greater than the size of the operating button to further overlie a portion of a surrounding surface of the electronics device, the adhesive layer being located to align with only one of the operating button or surrounding surface.

* * * * *